US007512851B2

(12) United States Patent
Wang et al.

(10) Patent No.: US 7,512,851 B2
(45) Date of Patent: Mar. 31, 2009

(54) METHOD AND APPARATUS FOR SHIFTING AT-SPEED SCAN PATTERNS IN A SCAN-BASED INTEGRATED CIRCUIT

(75) Inventors: Laung-Terng Wang, Sunnyvale, CA (US); Khader S. Abdel-Hafez, San Francisco, CA (US); Xiaoqing Wen, Sunnyvale, CA (US); Boryau (Jack) Sheu, San Jose, CA (US); Fei-Sheng Hsu, Hsinchu (TW); Augusli Kifli, Hsinchu (TW); Shyh-Horng Lin, Taipei (TW); Shianling Wu, Princeton Junction, NJ (US); Shun-Miin (Sam) Wang, San Jose, CA (US); Ming-Tung Chang, Changhua (TW)

(73) Assignee: Syntest Technologies, Inc., Sunnyvale, CA (US)

( * ) Notice: Subject to any disclaimer, the term of this patent is extended or adjusted under 35 U.S.C. 154(b) by 235 days.

(21) Appl. No.: 10/901,298

(22) Filed: Jul. 29, 2004

(65) Prior Publication Data
US 2005/0055617 A1    Mar. 10, 2005

Related U.S. Application Data

(60) Provisional application No. 60/491,551, filed on Aug. 1, 2003.

(51) Int. Cl.
*G01R 31/28* (2006.01)
(52) U.S. Cl. .................................. 714/726; 714/729
(58) Field of Classification Search ................ 714/726, 714/729
See application file for complete search history.

(56) References Cited

U.S. PATENT DOCUMENTS

| 5,751,694 | A | * | 5/1998 | Toft ........................... 370/503 |
| 6,151,336 | A | | 11/2000 | Cheng et al. ................. 370/535 |
| 6,327,687 | B1 | * | 12/2001 | Rajski et al. ................. 714/738 |
| 6,539,034 | B1 | | 3/2003 | Shimosaka ................... 370/535 |

OTHER PUBLICATIONS

Rajski et al., "Test Data Decompression for Multiple Scan Designs with Boundary Scan", IEEE Transactions on Computers, vol. 47, No. 11, Nov. 1998.*
Jas et al., "Virtual Scan Chains: A Means for Reducing Scan Length in cores," Proc., IEEE VLSI Test Symposium, pp. 73-78, Apr. 2000.*
I. Bayraktaroglu, and A. Orailoglu, "Test Volume and Application Time Reduction Through Scan Chain Concealment," Proc., IEEE 38th Design Automation Conf., pp. 151-155, 2001.

(Continued)

*Primary Examiner*—Cynthia Britt
*Assistant Examiner*—John J Tabone, Jr.
(74) *Attorney, Agent, or Firm*—Bacon & Thomas, PLLC

(57) ABSTRACT

A method and apparatus time-division demultiplexes and decompresses a compressed input stimulus provided at a selected data rate R1, into a decompressed stimulus, driven at a selected data rate R2, for driving selected scan chains in a scan-based integrated circuit using a plurality of time-division demultiplexors and time-division multiplexors for shifting stimuli and test responses in and out of high-speed I/O pads in order to reduce test time, test cost, and scan pin count. A synthesis method is also proposed for synthesizing the time-division multiplexors, decompressors, compressors, and time-division multiplexors.

46 Claims, 12 Drawing Sheets

OTHER PUBLICATIONS

I. Hamzaoglu, and J.H. Patel, "Reducing Test Application Time for Full Scan Embedded Cores," Proc., IEEE 29th Fault-Tolerant Computing Symposium, pp. 260-267, 1999.

S. Hellebrand, J. Rajski, S. Tarnick, S. Venkataraman, and B. Courtois, "Built-in Test for Circuits with Scan Based Reseeding of Multiple Polynomial Linear Feedback Shift Registers", *IEEE Transactions on Computers*, vol. C-44, pp. 223-233, Feb. 1995.

A. Jas, B. Pouya, and N. Touba, "Virtual Scan Chains: A Means for Reducing Scan Length in Cores," Proc., IEEE VLSI Test Symposium, pp. 73-78, Apr. 2000.

K.-J. Lee, J.-J. Chen, and C.-H. Huang, "Broadcasting Test Patterns to Multiple Circuits", *IEEE Transactions on Computer-Aided Design of Integrated Circuits and Systems*, vol. 18, No. 12, pp. 1793-1802, Dec. 1999.

A.R. Pandey, and J.H. Patel, "An Incremental Algorithm for Test Generation in Illinois Scan Architecture Based Designs," Proc., IEEE 2002 Design, Automation and Test in Europe (Date), pp. 368-375, 2002.

J. Rajski, J. Tyszer, and N. Zacharia, "Test Data Decompression for Multiple Scan Designs with Boundary Scan", *IEEE Transactions on Computers*, vol. 47, No. 11, Nov. 1998.

B. Koenemann, "LFSR-Coded Test Patterns for Scan Designs", Proc., European Test Conf., pp. 237-242, 1991.

\* cited by examiner

METHOD AND APPARATUS FOR SHIFTING AT-SPEED SCAN PATTERNS IN A SCAN-BASED INTEGRATED CIRCUIT

RELATED APPLICATION DATA

This application claims the benefit of U.S. Provisional Application No. 60/491,551 filed Aug. 1, 2003, which is hereby incorporated by reference.

TECHNICAL FIELD

The present invention generally relates to the field of logic design and test using design-for-test (DFT) techniques. Specifically, the present invention relates to the field of logic test and diagnosis for integrated circuits using scan or built-in self-test (BIST) techniques.

BACKGROUND

In this specification, the term integrated circuit is used to describe a chip or MCM (multi-chip module), embedded with DFT (design-for-test) techniques.

The scan-based DFT technique is the most widely used method for producing high quality integrated circuits. The scan-based DFT technique requires that all storage elements (sequential logic gates) existing in an integrated circuit, such as D flip-flops, be replaced with their scan-equivalent storage elements, such as Scan D flip-flops, otherwise known as scan cells (SCs). These scan cells are then connected to form one or more scan chains each controlled by one or more scan enable (SE) signals and scan clocks (SCKs) each belonging to a separate clock or frequency domain, see FIG. 1.

Testing a scan-based integrated circuit proceeds in a sequence of shift and capture operations, which are repeated for a number of test patterns. In order to distinguish between shift and capture operations, a scan enable (SE) signal local to all scan cells in a clock domain is used to select either the shift path or the functional path as the path to provide a new value to update a scan cell. In the shift operation, the shift path is selected in order to shift desired test stimuli into scan cells belonging to all the different scan chains and at the same time shift captured test responses out for comparison with expected values. In the capture operation, the functional path is selected in order to update the scan cells with the test response from the combinational part of the scan-based integrated circuit.

Test stimuli are shifted into scan chains through input pads and test responses are shifted out through output pads. These I/O pads are usually designed for use in functional mode, and can usually operate at very high frequencies, ranging from a few hundred MHz to a few GHz. However, scan chains, which are only used in test mode, usually only operate at a much lower frequency, ranging from 10 MHz to 100 MHz. Designing scan chains that operate at the same high frequency as I/O pads places a big burden on the design team, and increases risks for introducing too much peak power consumption during test. As a result, a big gap usually exists between the frequency at which I/O pads tied to scan chains operate in test mode, and the frequency at which these I/O pads operate in functional mode. Operating the scan chains and I/O pads at a lower frequency in test mode has the disadvantage of increasing test time and test cost. Furthermore, this prevents us from being able to test the I/O pads at-speed during test, which can reduce test quality or increase test cost, by requiring a separate at-speed test for these I/O pads.

Prior art solution #1, see FIG. 2, uses pairs of decompressors and compressors to reduce test time, test cost, and test data volume of a scan-based integrated circuit during scan test. The U.S. Pat. No. 6,327,687, co-authored by Rajski et al., described a general design of the decompressor and compressor. The U.S. Patent Application 2003/0154433, co-authored by Wang et al., described another general design of the decompressor and compressor, called broadcaster and compactor, respectively. All decompressors and compressors are, in general, operated at the same frequency as the scan-based integrated circuit. Although this solution results in a reduction in test time, test cost, and test data volume, it needs to operate all high-speed I/O pads at a low frequency in test mode. This means that a separate set of test patterns are required to test these I/O pads.

Prior art solution #2, see FIG. 3A and FIG. 3B, uses pairs of time-division demultiplexors (TDDMs) and time-division multiplexors (TDMs) to allow each high-speed I/O pad to operate at a high frequency or at its respective clock rate (at-speed), while operating the internal scan chains at a low frequency. The time-division demultiplexors (TDDMs) are used to demultiplex high-frequency scan data applied to each scan input I/O pad into low-frequency scan data applied to multiple scan-chains. Similarly, the time-division multiplexors (TDMs) are used to multiplex low-frequency scan data from multiple scan chains into high-frequency scan data coming out of each scan output I/O pad. This way, the I/O pads and scan chains can operate at different frequencies during test. Although this solution does result in a reduction in test time and test cost as opposed to operating both I/O pads and scan chains at a low frequency, it does not result in a reduction in the test data volume.

Therefore, there is a need for an improved method and apparatus for further reducing test time, test cost, and test data volume, while at the same time allowing all high-speed I/O pads to operate at high frequencies or at their respective clock rates. The improved method and apparatus shall also allow for reduced pin-count test to ease production test, prototype debug, fault diagnosis, and yield improvement.

SUMMARY

Accordingly, a major objective of the present invention is to provide an improved method and apparatus to further reduce test time, test cost, test data volume, and scan pin count for a scan-based integrated circuit. The method and apparatus comprises using a time-division demultiplexing and time-division multiplexing technique for allowing scan data transfer between high-speed I/O pads and the low-speed internal scan chains in the scan-based integrated circuit during test. The present invention adds decompressor and compressor pairs to the design to perform scan compression in addition to using the time-division demultiplexor and multiplexor pairs to operate the I/O pads at high speed, while operating the internal scan chains at low speed. Each decompressor and compressor pair can be placed selectively before or after the time-division demultiplexor and multiplexor pair. The design according to the present invention is summarized as follows:

(1) Test Data Volume Reduction Using Decompressor and Compressor Pairs

In order to reduce the test data volume associated with the scan test, a decompressor is added to decompress the compressed input stimulus applied by an ATE (automatic test equipment) to the scan input pads internally and broadcast the result to internal scan chains simultaneously. A compressor is also added at the output of the internal scan chains to compress the test response into a compressed test response. The decompressor can be a broadcaster or a linear finite-state machine (LFSM), having fewer inputs than outputs, used to perform space expansion. A compressor can be a compactor or a multiple-input signature register (MISR), having fewer outputs than inputs, used to perform space compaction. By using a pair of decompressor and compressor, the scan chain length is also reduced, which further reduces test time and test cost.

(2) Test Time Reduction Using Time-division Demultiplexor and Multiplexor Pairs

The solution according to the present invention uses pairs of time-division demultiplexors (TDDMs) and time-division multiplexors (TDMs) to allow each I/O pad to operate at a high frequency or at its respective clock rates (at-speed), while operating the internal scan chains at a low frequency. The time-division demultiplexors (TDDMs) are used to demultiplex high-frequency scan data applied to each scan input I/O pad into low-frequency scan data applied to multiple scan chains. Similarly, the time-division multiplexors (TDMs) are used to multiplex low-frequency scan data from multiple scan chains into high-frequency scan data coming out of each scan output I/O pad. This way, the I/O pads and scan chains can operate at different frequencies during test. This results in a further reduction in both test time and scan pin count.

Hence, by using both time-division demultiplexor and multiplexor pairs and decompressor and compressor pairs, the solution according to the present invention is able to reduce test cost by reducing both test time and test data volume, while operating the external I/O pads at a high frequency and testing them at-speed, and operating the internal scan chains at a low frequency for scan test power reduction.

BRIEF DESCRIPTION OF DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
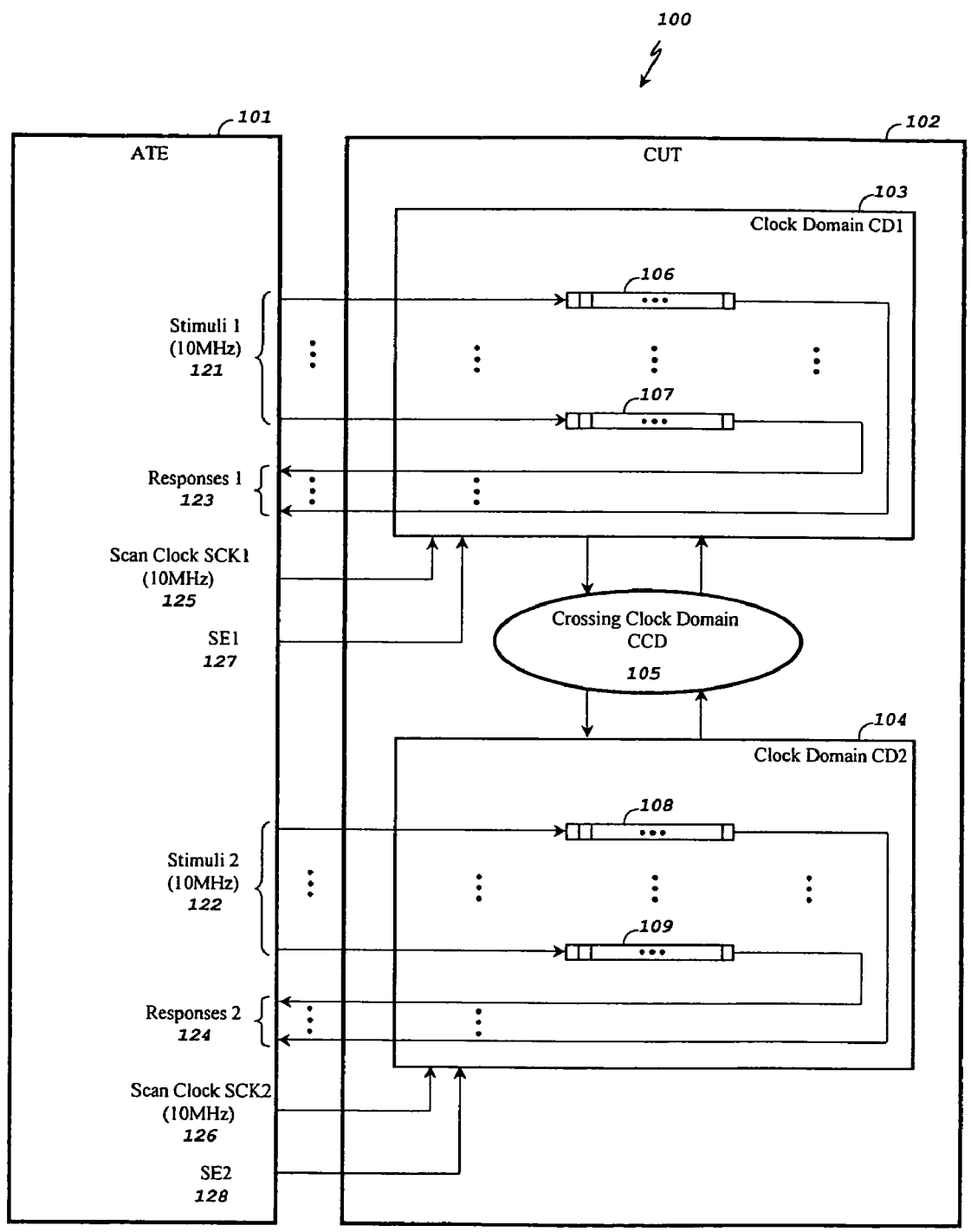
FIG. 1 shows a block diagram of a conventional system for testing a scan-based integrated circuit, whose I/O pads can operate at 80 MHz and 160 Hz but the scan chains can only operate at 10 MHz, by using an ATE (automatic test equipment)

FIG. 1 shows a block diagram 100 of a conventional system for testing a scan-based integrated circuit, whose I/O pads can operate at 80 MHz and 160 MHz but the scan chains can only operate at 10 MHz, by using an ATE (automatic test equipment). The system 100 includes an ATE 101 and a circuit-under-test (CUT) 102.

The CUT 102 contains two clock domains CD1 103 and CD2 104, as well as a crossing clock domain CCD 105. Scan cells in CD1 103 are connected into scan chains 106, . . . , 107. The I/O pads for these scan chains can operate at 80 MHz while the scan chains can only operate at 10 MHz. In addition, scan cells in CD2 104 are connected into scan chains 108, . . . , 109. The I/O pads for these scan chains can operate at 160 MHz while the scan chains can only operate at 10 MHz.

In general, since I/O pads are designed for use in functional mode, they can operate at very high frequencies, ranging from a few hundred MHz to a few GHz. On the other hand, since scan chains are used in test mode, they usually only operate at much lower frequencies, ranging from 10 MHz to 100 MHz. This is because operating scan chains at high frequencies not only has huge design impact, but also may damage a chip due to too much peak power consumption during test.

During test, the ATE 101 applies test stimuli, Stimuli 1 121 and Stimuli 2 122, to their respective scan chains, 106, . . . , 107 and 108, . . . , 109, of the CUT 102, via the I/O pads connected to the scan-based integrated circuit. First, a shift operation is conducted when both scan enable signals SE1 127 and SE2 128 are asserted. Scan clocks SCK1 125 and SCK2 126 control the shift operation. After a stimulus, 121 and 122, is shifted into these scan chains 106 to 109, a capture operation is conducted to load its corresponding test response into the scan chains. The captured test response, 123 and 124, is then shifted out to the ATE 101 for comparison, while a new stimulus is shifted into scan chains 106 to 109.

Since these I/O pads are connected directly to the scan chains, the frequency at which the I/O pads operate is limited by the frequency of the scan chains. In this case, the I/O pads have to operate at a reduced speed of 10 MHz although they are capable of operating at 80 Hz and 160 MHz, respectively. As a result, this direct-connection scheme has a number of disadvantages: (1) Test time can become a problem due to low-frequency scan chain operations. (2) Test data volume can become a problem due to long scan chain lengths. (3) Scan pin count can become too large if one needs to reduce scan chain lengths by increasing the number of scan chains in order to reduce test data volume. (4) I/O pads are not tested at-speed during scan test, which either reduces test quality if no further testing is conducted or increases test cost if at-speed I/O testing is conducted separately.

In order to show the benefits of other solutions, including the present invention, as will be described in the following descriptions, we denote test time, test data volume, and scan pin count using this direct-connection scheme each as 1×.

Figure 2:
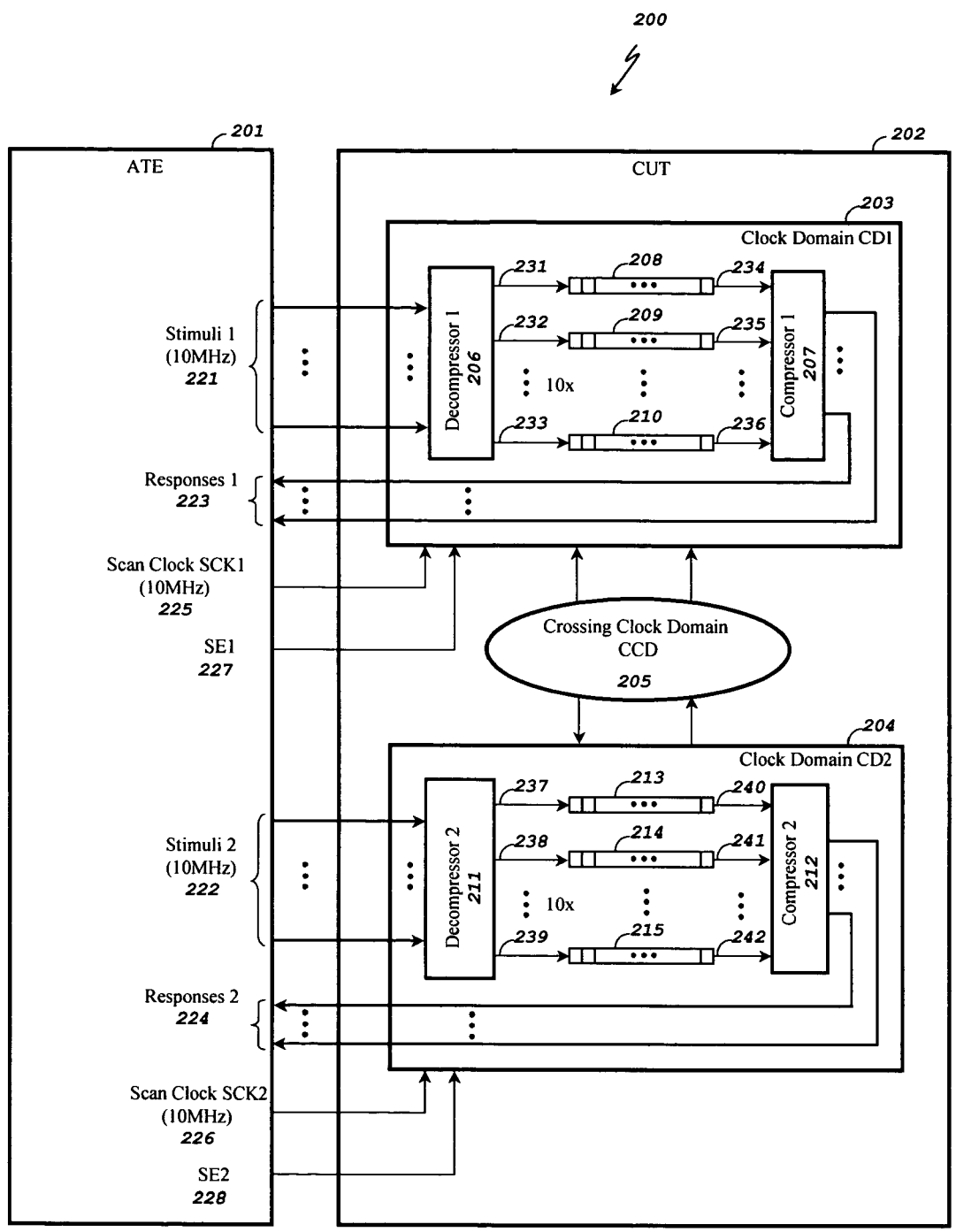
FIG. 2 shows a block diagram of prior art solution #1 using decompressor and compressor pairs, while operating I/O pads and scan chains at 10 Hz, to reduce test time and test data volume by 10×.

FIG. 2 shows a block diagram 200 of prior art solution #1 using decompressor and compressor pairs, while operating I/O pads and scan chains at 10 MHz, to reduce test time and test data volume by 10×. The block diagram 200 includes an ATE (automatic test equipment) 201 and a circuit-under-test (CUT) 202. Reduction on test time and test data volume is achieved by splitting original scan chains into shorter scan chains. The gap between the number of external I/O pads and the number of internal scan chains are bridged by inserting decompressor and compressor pairs into the scan-based integrated circuit.

In clock domain CD1 203, for example, all original scan chains, refer to 106 to 107 of FIG. 1, are split into 10× shorter scan chains 208, 209, . . . , 210. During each shift operation, the decompressor, Decompressor 1 206, decompresses each of the supplied test stimuli, Stimuli 1 221, into a decompressed stimulus 231, 232, . . . , 233 and then applies it to all scan chains 208, 209, . . . , 210. After capture, the captured test response 234, 235, . . . , 236 is compressed by the compressor, Compressor 1 207, into a compressed test response, Responses 1 223, and shifted out to the ATE 201 for comparison.

Since the longest scan chain length is now reduced by 10× with this scheme, we expect the circuit's test time and test data volume can be reduced by 10× because both measures are proportional to the longest scan chain length. However, all I/O pads still operate at a low frequency of the scan chains, rather than at their original high frequencies in functional mode. This can either reduce test quality if no further testing is conducted or increase test cost if at-speed I/O testing is conducted separately. In addition, the scan pin count issue is not addressed.

Figure 3A:
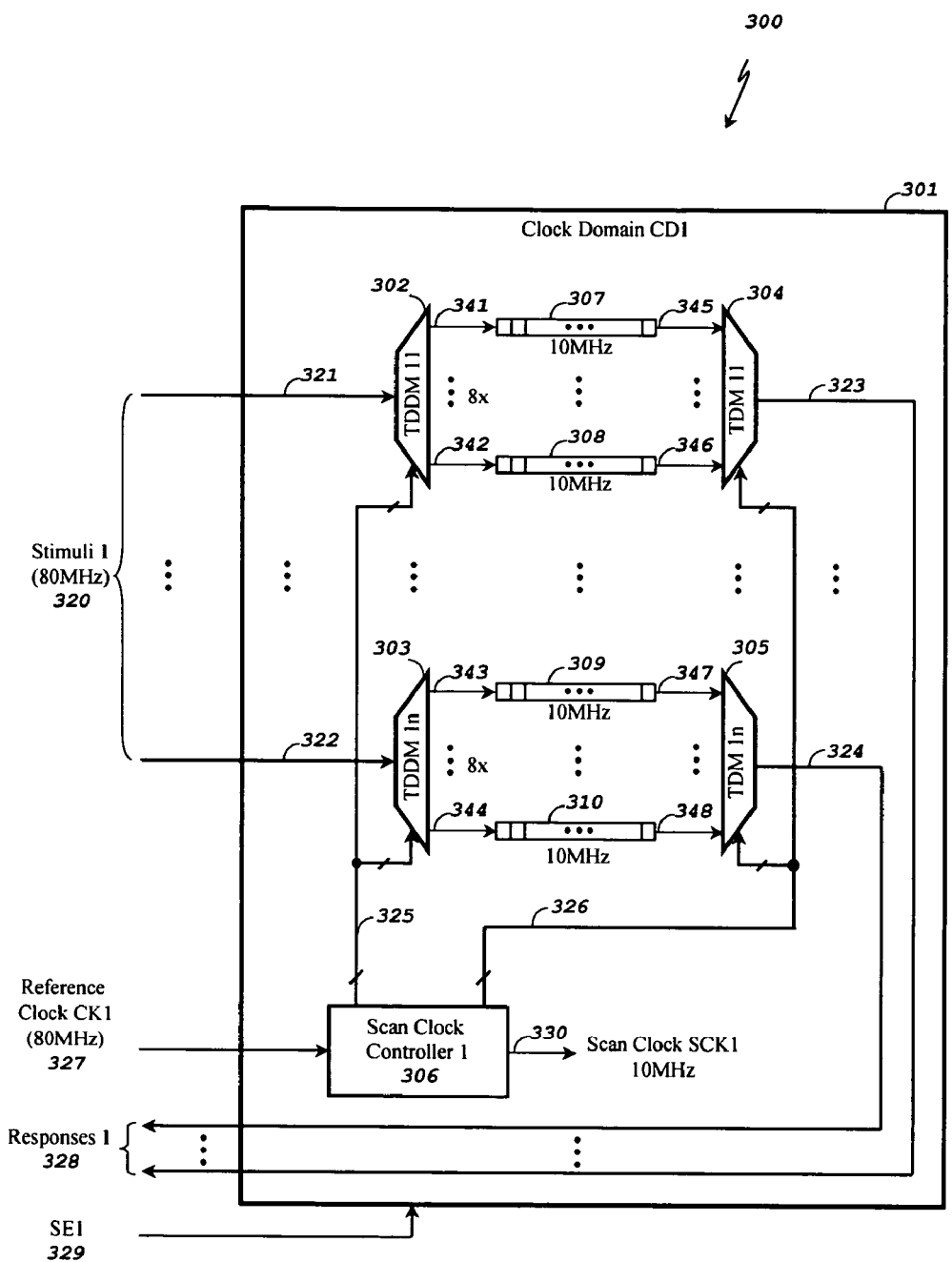
FIG. 3A shows a partial block diagram of prior art solution #2 of operating I/O pads at 80 MHz and scan chains at 10 MHz by using time-division demultiplexor (TDDM) and time-division multiplexor (TDM) pairs, to reduce test time and scan pin count by 8×.

FIG. 3A shows a partial block diagram 300 of prior art solution #2 of operating I/O pads at 80 MHz and scan chains at 10 MHz by using time-division demultiplexor (TDDM) and time-division multiplexor (TDM) pairs, to reduce test time and scan pin count by 8×, for clock domain CD1 301.

The gap between the speed of the I/O pads and the speed of the scan chains are bridged by splitting internal scan chains and inserting TDDM and TDM pairs into the scan-based integrated circuit.

In clock domain CD1 301, for example, all original scan chains, refer to 106 to 107 of FIG. 1, are split into 8× shorter scan chains 307, . . . , 308, . . . , 309, . . . , 310. In addition, n TDDM and TDM pairs, <TDDM11 302, TDM11 304>, . . . , <TDDM1n 303, TDM1n 305> are inserted, where n is the number of I/O pads for this clock domain. <TDDM11 302, TDM11 304> is connected to scan chains 307, . . . , 308, . . . , and <TDDM1n, 303, TDM1n 305> is connected to scan chains 309, . . . , 310, respectively. The test stimuli, Stimuli 1 320, are applied through I/O pads to TDDM11 302, . . . , TDDM1n 303 at the speed of 80 MHz. In addition, the test responses, Responses 1 328, are collected through I/O pads from TDM11 304, . . . , TDM1n 305 at the speed of 80 MHz. The Scan Clock Controller 1 306 uses a reference clock CK1 327 of 80 MHz to generate scan clock SCK1 330 at 10 MHz and time-division control signals 325 and 326 at 80 MHz. A TDDM demultiplexes a compressed input stimulus from one input pad to 8 internal scan chains; while a TDM multiplexes the output values from 8 internal scan chains into one bit of compressed response to be observed at one output pad.

Since the I/O pads operate at a speed 8× higher than the scan chains, test time and scan pin count can be reduced by 8×. In addition, all I/O pads can be tested at-speed during test. This eliminates the need for conducting a separate at-speed I/O test, further reducing test cost. However, this solution does not address the test data volume issue.

Figure 3B:
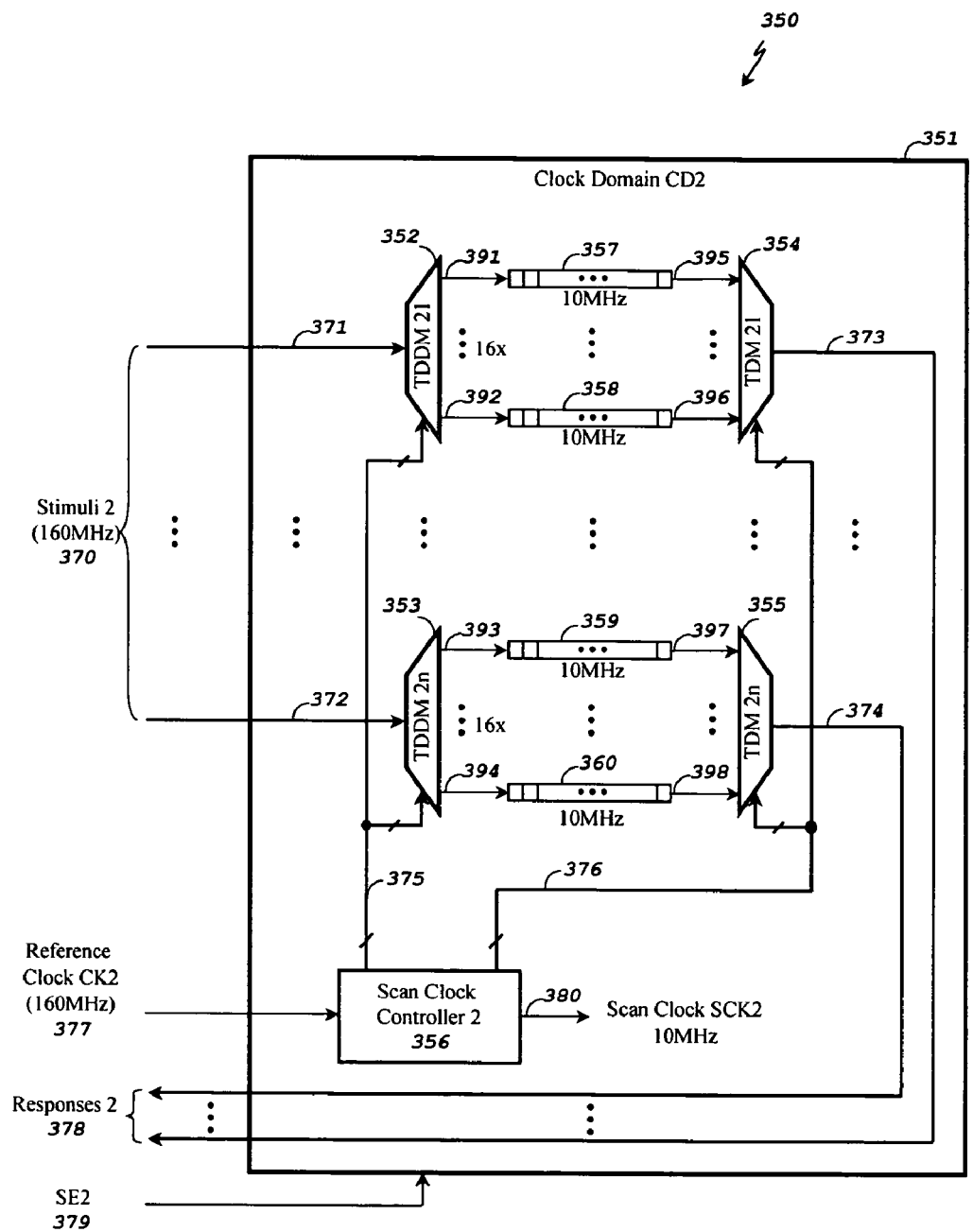
FIG. 3B shows a partial block diagram of a prior art solution #2 of operating I/O pads at 160 MHz and scan chains at 10 MHz by using time-division demultiplexor (TDDM) and time-division multiplexor (TDM) pairs, to reduce test time and scan pin count by 16×.

FIG. 3B shows a partial block diagram 350 of a prior art solution #2 of operating I/O pads at 160 MHz and scan chains at 10 MHz by using time-division demultiplexor (TDDM) and time-division multiplexor (TDM) pairs, to reduce test time and scan pin count by 16×, for clock domain CD2 351. It is similar to what has been described in FIG. 3A except that the I/O pads now operate at 160 MHz.

Figure 4:
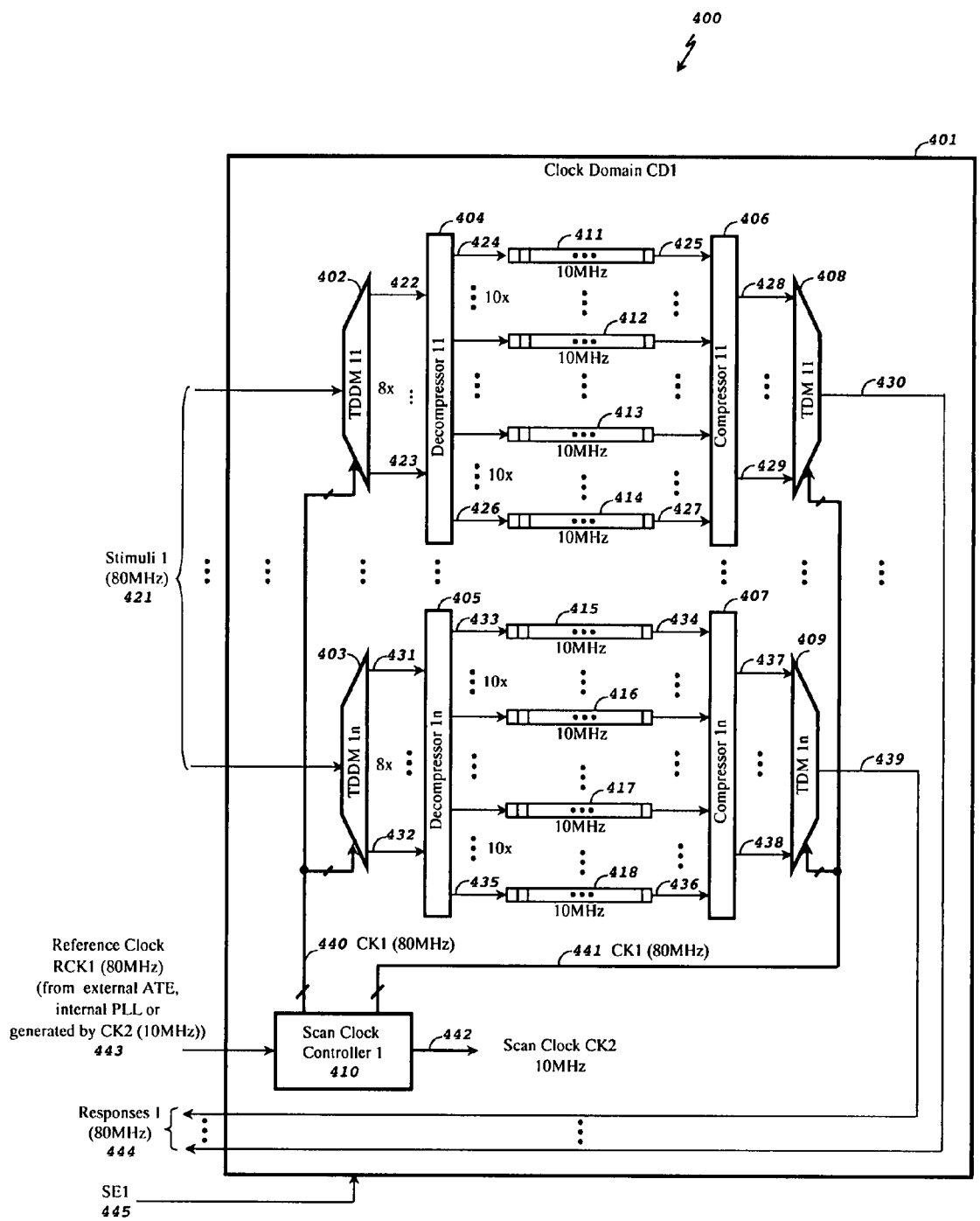
FIG. 4 shows a partial block diagram of a solution of operating I/O pads at 80 MHz and scan chains at 10 MHz by using time-division demultiplexor (TDDM) and time-division multiplexor (TDM) pairs as well as decompressor and compressor pairs, with decompressors placed after TDDMs and compressors placed before TDMs, in order to reduce test time by 80×, test data volume by 10×, and scan pin count by 8×, in accordance with the present invention.

FIG. 4 shows a partial block diagram 400 of a solution of operating I/O pads at 80 MHz and scan chains at 10 MHz by using time-division demultiplexor (TDDM) and time-division multiplexor (TDM) pairs as well as decompressor and compressor pairs, with decompressors placed after TDDMs and compressors placed before TDMs, in order to reduce test time by 80×, test data volume by 10×, and scan pin count by 8×, in accordance with the present invention.

The partial block diagram 400 shows one clock domain CD1 401, which contains n TDDM and TDM pairs, where n is the number of I/O pads for this clock domain. They are <TDDM11 402, TDM11 408>, . . . , <TDDM1n 403, TDM1n 409>. CD1 401 also contains n decompressor and compressor pairs. They are <Decompressor11 404, Compressor11 406>, . . . , <Decompressor1n 405, Compressor1n 407>. The Scan Clock Controller 1 410 uses a reference clock RCK1 443 of 80 MHz to generate scan clock CK2 442 at 10 MHz and time-division control signals CK1 440 and 441 at 80 MHz. Note that one original scan chain is split into 80 shorter scan chains. The resulting scan chains are 411, . . . , 412, . . . , 413, . . . , 414, . . . , 415, . . . , 416, . . . , 417, . . . , 418.

A decompressor 404 is used to decompress or broadcast one bit of test data at each of its inputs 422, . . . 423 to 10 internal scan chains 411 to 414; while a compressor 406 is used to compress each 10 bits of test responses 425, . . . 427 into one bit of the compressed test responses 428, . . . , 429. All scan chains as well as decompressors and compressors pairs operate at 10 MHz, while all I/O pads operate at 80 MHz. This means that one input pad can drive 8 inputs of a decompressor and that one output pad can collect test response from 8 outputs of a compressor. As a result, test time can be reduced by 80×, test data volume can be reduced by 10×, and scan pin count can be reduced by 8×. Furthermore, all I/O pads can be tested at-speed during test. This eliminates the need for conducting a separate at-speed I/O test, further reducing test cost.

A TDDM can be a shift register. In a broad sense, the TDDM can comprise one or more sequential logic gates, such as flip-flops or latches. It can also comprise one or more combinational logic gates, such as AND gates, OR gates, NAND gates, NOR gates, Exclusive-OR (XOR) gates, Exclusive-NOR (XNOR) gates, multiplexors (MUXs), buffers (BUFs), or inverters (INVs). The TDDM usually operates at a high frequency.

A TDM can comprise a multiplexor and a scan clock controller. In a broad sense, the TDDM can comprise one or more sequential logic gates, such as flip-flops or latches. It can also comprise one or more combinational logic gates, such as AND gates, OR gates, NAND gates, NOR gates, Exclusive-OR (XOR) gates, Exclusive-NOR (XNOR) gates, multiplexors (MUXs), buffers (BUFs), or inverters (INVs). The TDM usually operates at a high frequency.

A decompressor can be combinational logic gates comprising one or more combinational logic gates, such as AND gates, OR gates, NAND gates, NOR gates, Exclusive-OR (XOR) gates, Exclusive-NOR (XNOR) gates, multiplexors (MUXs), buffers (BUFs), or inverters (INVs). It can also be a linear finite-state machine (LFSM) comprising one or more sequential logic gates, such as flip-flops or latches. If a decompressor is placed after a TDDM, it usually operates at a low frequency. If a decompressor is placed before a TDDM, which will be shown in FIG. 7, it usually needs to operate at a high frequency.

A compressor can be combinational logic gates comprising one or more combinational logic gates, such as AND gates, OR gates, NAND gates, NOR gates, Exclusive-OR (XOR) gates, Exclusive-NOR (XNOR) gates, multiplexors (MUXs), buffers (BUFs), or inverters (INVs). It can also be a multiple-input signature register (MISR) comprising one or more sequential logic gates, such as flip-flops or latches. If a compressor is placed before a TDM, it usually operates at a low frequency. If a compressor is placed after a TDM, which will be shown in FIG. 7, it usually needs to operate at a high frequency.

Also note that the high frequency mentioned above should be a greater-than-one integer multiple of the low frequency mentioned above.

Figure 5A:
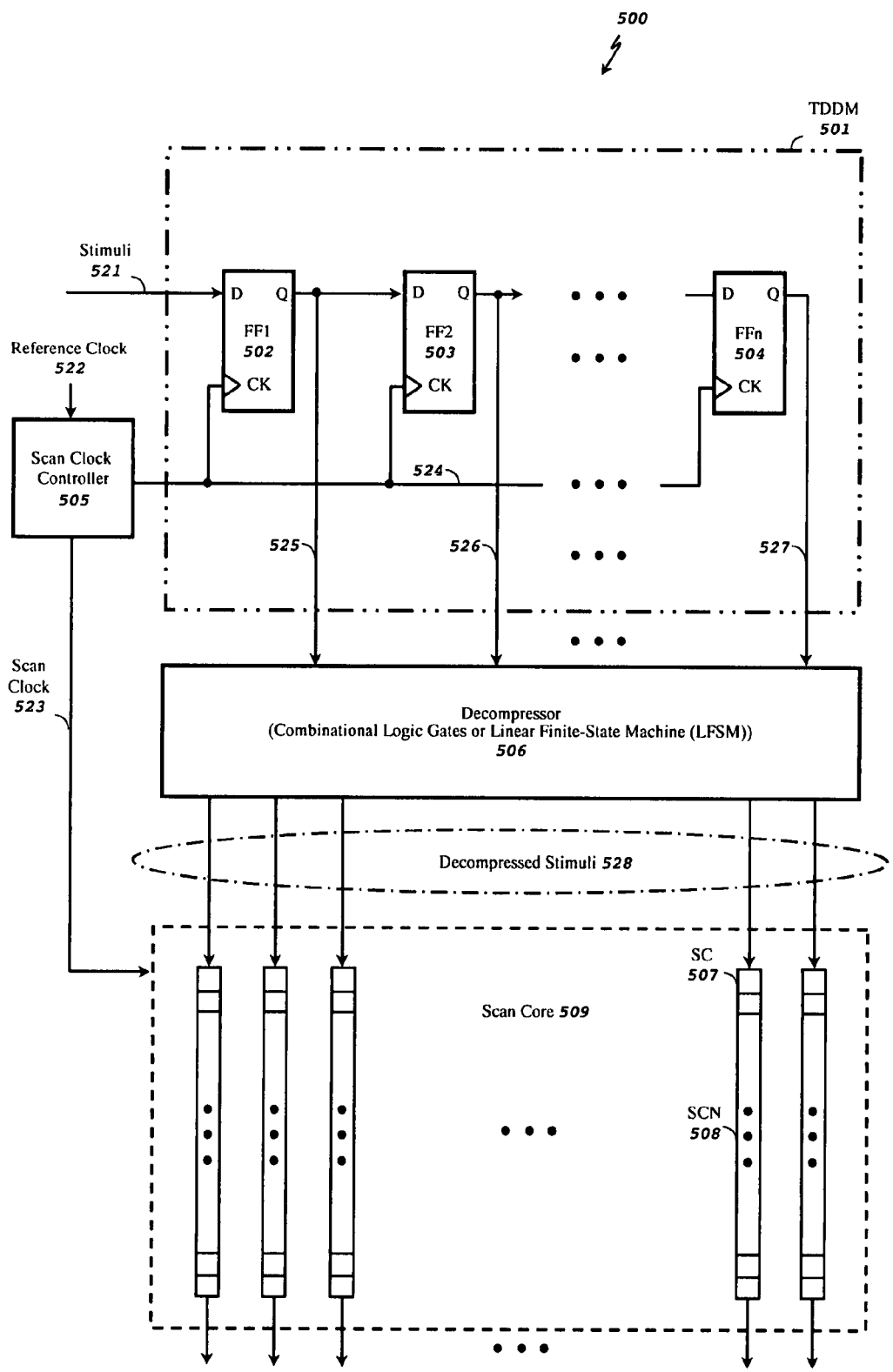
FIG. 5A shows a block diagram of a time-division demultiplexor (TDDM), together with a single-level decompressor, in accordance with the present invention.

FIG. 5A shows a block diagram 500 of an example of time-division demultiplexor (TDDM) 501, together with a single-level decompressor 506, in accordance with the present invention.

The TDDM 501 is a shift-register composed of flip-flops FF1 502, FF2 503, . . . , and FFn 504. The input to the shift-register is the test stimuli 521. The clock of the shift-register is clock 524 generated from the scan clock controller 505, where the clock 524 has the same frequency as the reference clock 522 and the scan clock 523 operates at a frequency lower than that of the reference clock 522. Obviously, if the frequency of the reference clock 522 is n times of that of the scan clock 523, then using a shift-register of n flip-flops can smoothly apply test stimuli to all internal scan chains through the decompressor 506.

The decompressor 506 can be combinational logic gates comprising one or more combinational logic gates, such as AND gates, OR gates, NAND gates, NOR gates, Exclusive-OR (XOR) gates, Exclusive-NOR (XNOR) gates, multiplexors (MUXs), buffers (BUFs), or inverters (INVs). It can also be a linear finite-state machine (LFSM) comprising one or more sequential logic gates, such as flip-flops or latches. In either case, since the decompressor 506 is placed after the TDDM 501, it can operate at a frequency as low as 1/n of the frequency of the reference clock 522. The decompressed stimuli 528 are applied to internal scan chains in the scan core 509. Note that these scan chains operate at a frequency as low as 1/n of the frequency of the reference clock 522.

Figure 5B:
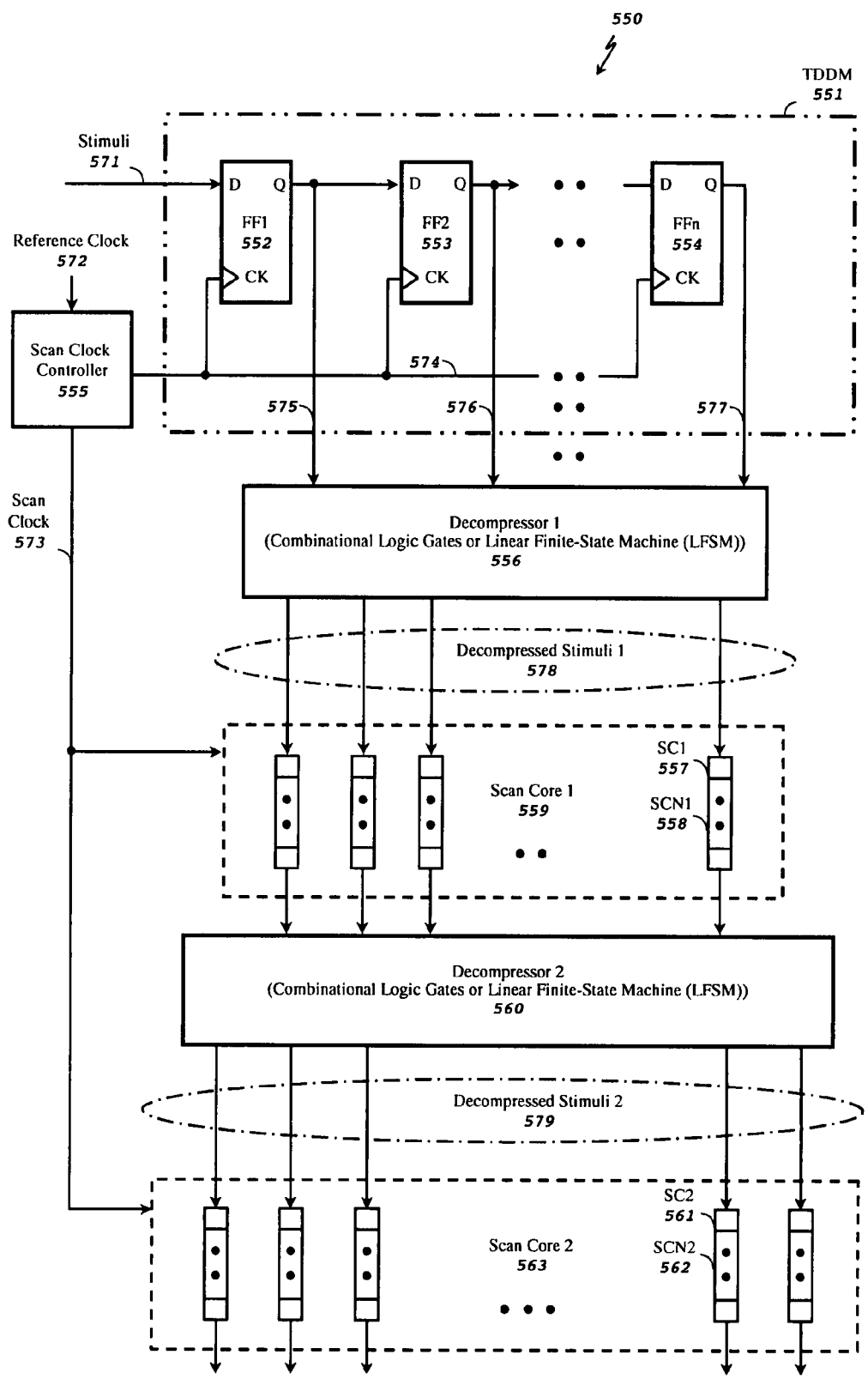
FIG. 5B shows a block diagram of a time-division demultiplexor (TDDM), together with two-level decompressors, in accordance with the present invention.

FIG. 5B shows a block diagram 550 of a time-division demultiplexor (TDDM) 551, together with two-level decompressors 556 and 560, in accordance with the present invention.

Decompressor 1 556 is placed between the TDDM 551 and Scan Core 1 559; while Decompressor 2 560 is embedded between two sets of scan chains in two different scan cores: Scan Core 1 559 and Scan Core 2 563. This scheme is effective in solving the serious timing delay issue that may be caused by a single-level, high decompression-rate decompressor. The TDDM 551 is a shift-register similar to the one shown in FIG. 5A and the input to the shift-register is the test stimuli 571. The scan clock controller 555 uses a reference clock 572 to generate a clock 574 to drive the flip-flops in the TDDM 551. The scan clock controller 555 also generates a scan clock 573 for Scan Core 1 559 and Scan Core 2 563. The TDDM 551 operates at the frequency n time faster than Scan Core 1 559 and Scan Core 2 563. As a result, this scheme allows the shift operation to be performed at high speed during test.

Figure 6A:
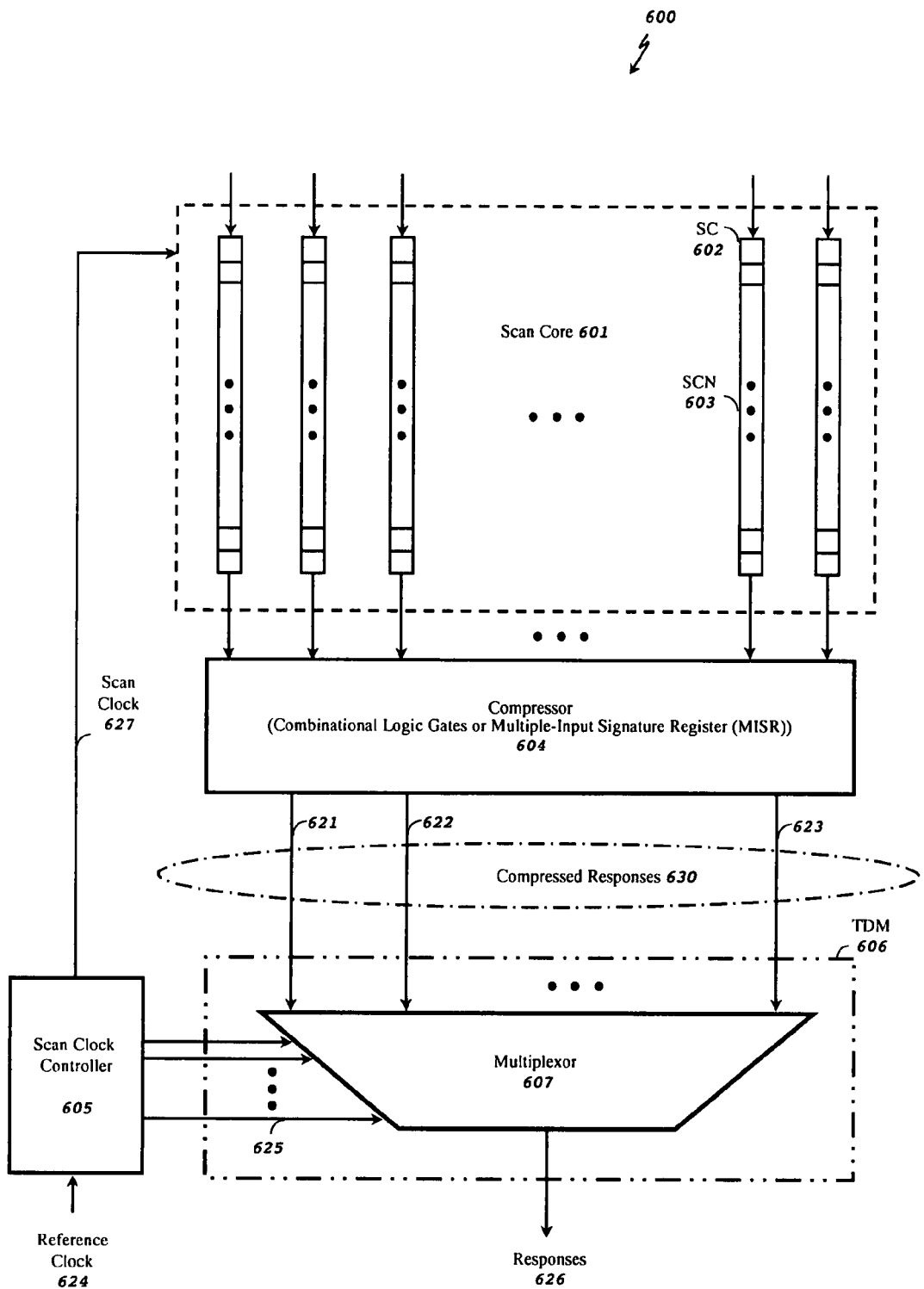
FIG. 6A shows a block diagram of a time-division multiplexor (TDM), together with a single-level compressor, in accordance with the present invention.

FIG. 6A shows a block diagram 600 of a time-division multiplexor (TDM) 606, together with a single-level compressor 604, in accordance with the present invention. The TDM 606 consists of an n-to-1 Multiplexor 607 controlled by a scan clock controller 605. A reference clock 624 drives the scan clock controller 605 to generate selection signals 625 for Multiplexer 607 at the same frequency of the reference clock 624. Obviously, if the frequency of the reference clock 624 is n times of that of the scan clock 627, then the n-to-1 Multiplexor 607 can smoothly collect compressed responses 630 from n outputs of the compressor 604.

The compressor 604 can be combinational logic gates comprising one or more combinational logic gates, such as AND gates, OR gates, NAND gates, NOR gates, Exclusive-OR (XOR) gates, Exclusive-NOR (XNOR) gates, multiplexors (MUXs), buffers (BUFs), or inverters (INVs). It can also be a multiple-input signature register (MISR) comprising one or more sequential logic gates, such as flip-flops or latches. In either case, since the compressor 604 is placed before the TDM 606, it can operate at a frequency as low as 1/n of the frequency of the reference clock 624. The compressed responses 630 are generated from the internal scan chains in the scan core 601. Note that these scan chains operate at a frequency as low as 1/n of the frequency of the reference clock 624.

Figure 6B:
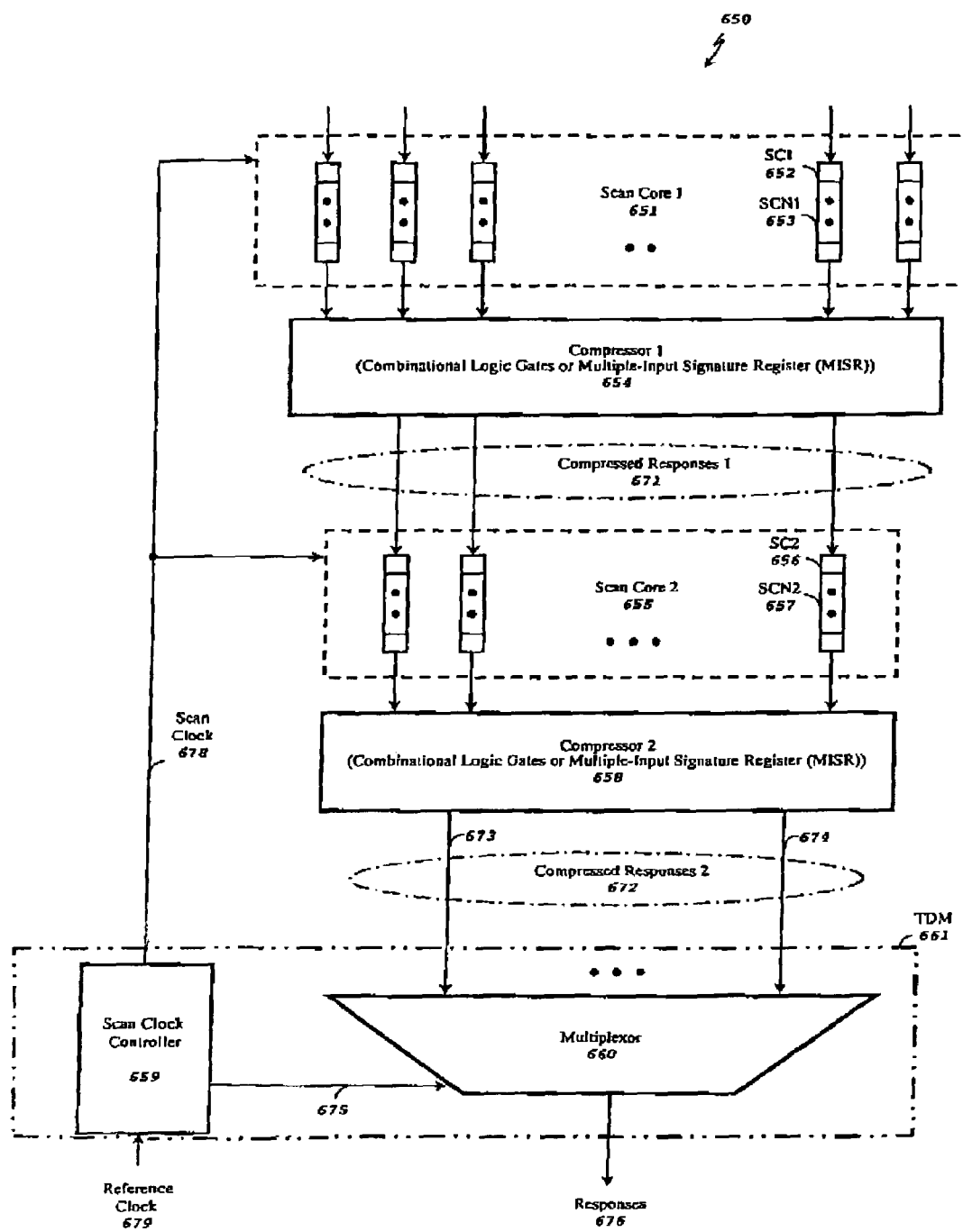
FIG. 6B shows a block diagram of a time-division multiplexor (TDM), together with two-level compressors, in accordance with the present invention.

FIG. 6B shows a block diagram 650 of a time-division multiplexor (TDM) 661, together with two-level compressors 654 and 658, in accordance with the present invention.

Compressor 1 654 is embedded between two sets of scan chains in two different scan cores: Scan Core 1 651 and Scan Core 2 655; while Compressor 2 658 is placed between Scan Core 2 655 and the TDM 661. This scheme is effective in solving the serious timing delay issue that may be caused by a single-level, high compression-rate compressor. The TDM 661 consists of an n-to-1 Multiplexor 660 controlled by the scan clock controller 659, similar to what are shown in FIG. 6A. The scan clock controller 659 uses the reference clock 679 to generate selection signals 675 for 660 at the same frequency of the reference clock 679. Obviously, if the frequency of the reference clock 679 is n times of that of the scan clock 678, the n-to-1 Multiplexor 660 can smoothly collect compressed responses 2 672 from all internal scan chains through Compressor 1 654 and Compressor 2 658. As a result, this scheme allows the shift operation to be performed at high speed during test.

Figure 7:
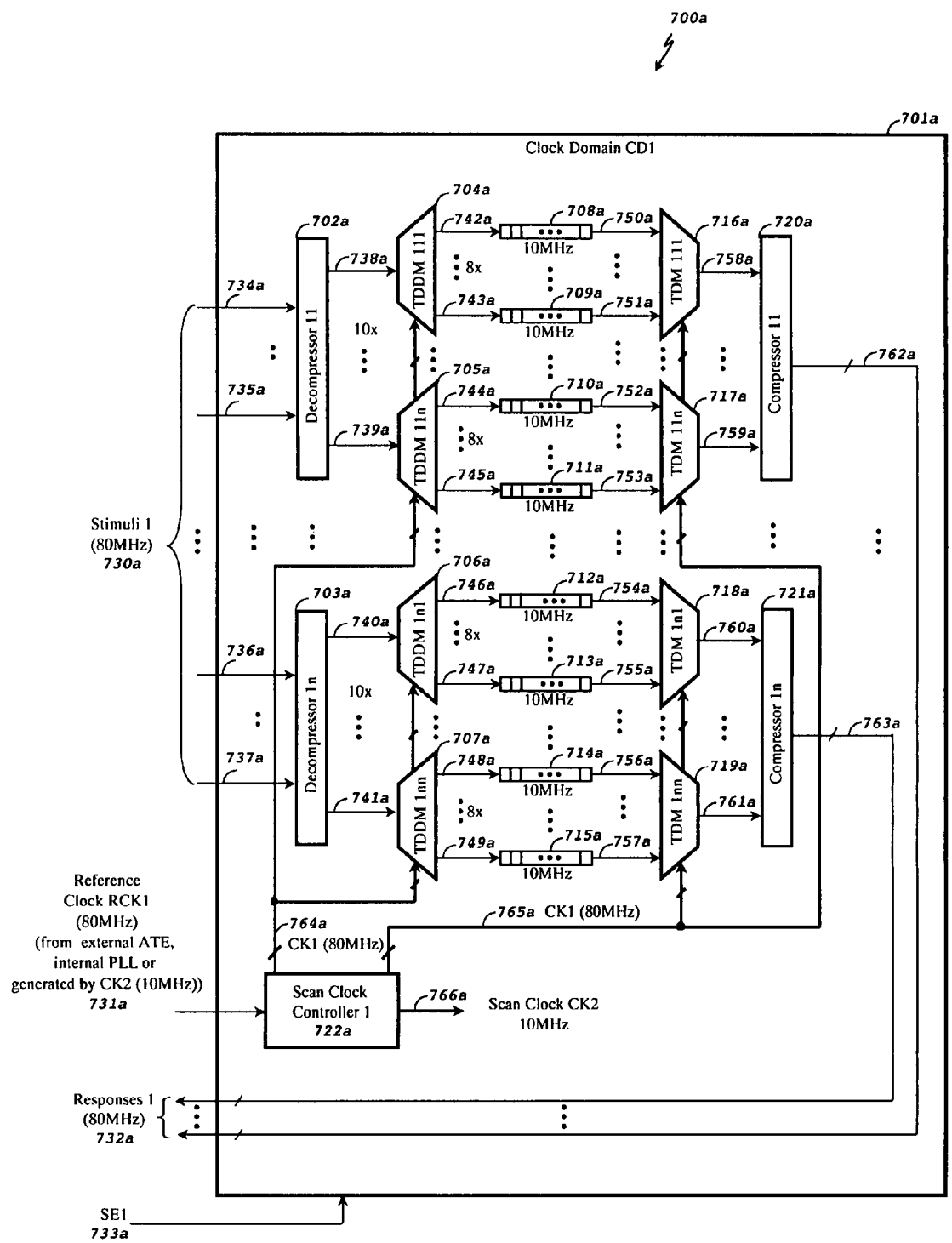
FIG. 7 shows a partial block diagram of a solution of operating I/O pads at 80 MHz and scan chains at 10 MHz by using time-division demultiplexor (TDDM) and time-division multiplexor (TDM) pairs as well as decompressor and compressor pairs, with decompressors placed before TDDMs and compressors placed after TDMs, in order to reduce test time by 80×, test data volume by 10×, and scan pin count by 8×, in accordance with the present invention.

FIG. 7 shows a partial block diagram 700*a* of a solution of operating I/O pads at 80 MHz and scan chains at 10 MHz by using time-division demultiplexor (TDDM) and time-division multiplexor (TDM) pairs as well as decompressor and compressor pairs, with decompressors placed before TDDMs and compressors placed after TDMs, in order to reduce test time by 80×, test data volume by 10×, and scan pin count by 8×, in accordance with the present invention.

This scheme is similar to what has been described in FIG. 4 except that decompressors are placed before TDDMs and that compressors are placed after TDMs. The difference is that a decompressor or a compressor in FIG. 7 needs to operate at a high frequency. Same as the scheme shown in FIG. 4, the scheme shown in FIG. 7 can also reduce test time by 80×, test data volume by 10×, and scan pin count by 8×.

Figure 8:
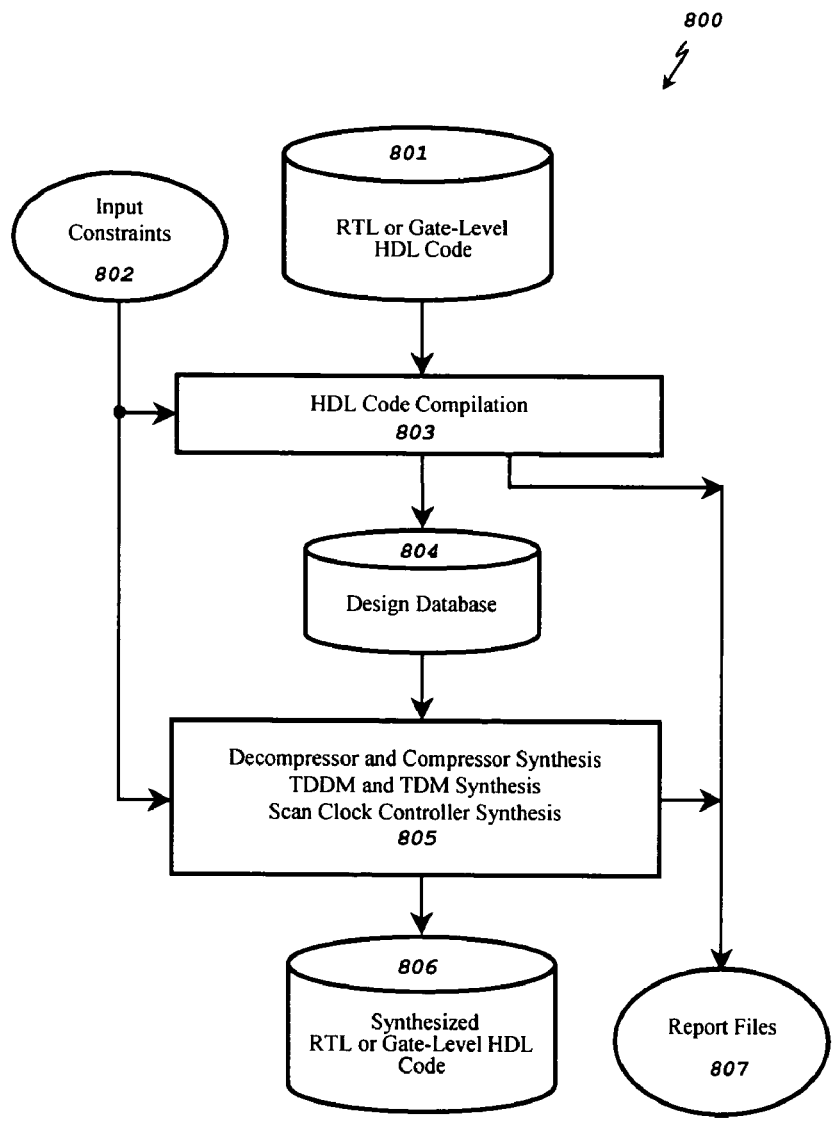
FIG. 8 shows a block diagram of a computer-aided design (CAD) system for decompressor and compressor synthesis, time-division demultiplexor (TDDM) and time-division multiplexor (TDM) synthesis, and scan clock controller synthesis, in a scan-based integrated circuit, in accordance with the present invention.

FIG. 8 shows a block diagram 800 of a computer-aided design (CAD) system for decompressor and compressor synthesis, time-division demultiplexor (TDDM) and time-division multiplexor (TDM) synthesis, and scan clock controller synthesis, in a scan-based integrated circuit, in accordance with the present invention. This system 800 accepts the user-supplied RTL or gate-level HDL (hardware description language) code 801 as design description. It also accepts input constraints 802. The HDL code is complied into an internal design database 804. Then, based on the input constraints 802, the task 805 of decompressor and compressor synthesis, time-division demultiplexor (TDDM) and time-division multiplexor (TDM) synthesis, and scan clock controller synthesis is performed. Upon completion, the synthesized RTL or gate-level HDL code 806 is generated while all reports and errors are saved in the report files 807.

Since the original scan-based integrated circuit may have embedded selected decomprerssors and compressors in the design, the CAD system will skip such decompressor and compressor synthesis when requested.

Figure 9:
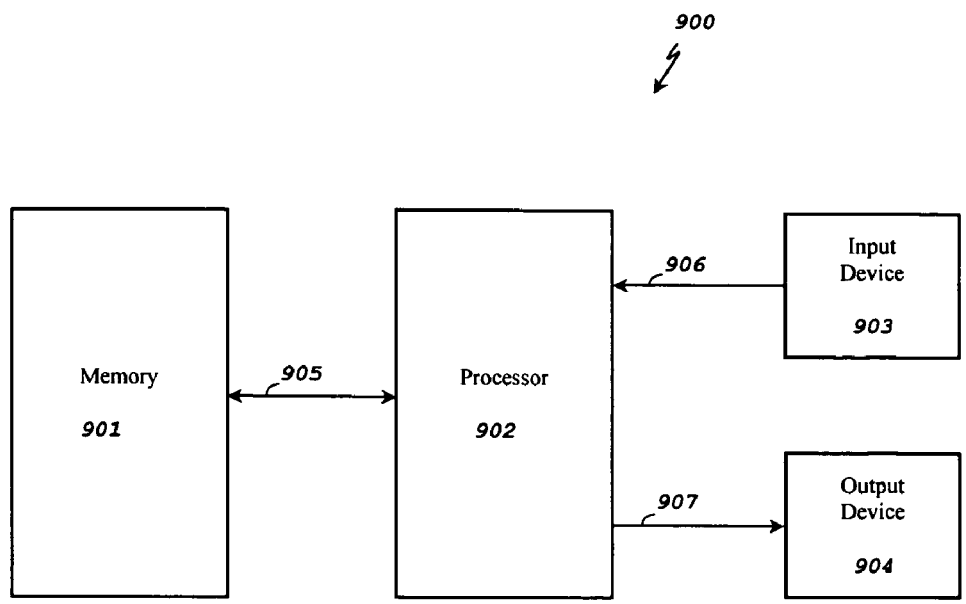
FIG. 9 shows an electronic design automation system, where a computer-readable program, in accordance with the present invention, performs a method for decompressor and compressor synthesis, time-division demultiplexor (TDDM) and time-division multiplexor (TDM) synthesis, and scan clock controller synthesis in a scan-based integrated circuit.

FIG. 9 shows an electronic design automation system 900, where a computer-readable program, in accordance with the present invention, performs a method for decompressor and compressor synthesis, time-division demultiplexor (TDDM) and time-division multiplexor (TDM) synthesis, and scan clock controller synthesis in a scan-based integrated circuit. The system includes a processor 902, which operates together with a memory 901 to run a set of software for decompressor and compressor synthesis, time-division demultiplexor (TDDM) and time-division multiplexor (TDM) synthesis, and scan clock controller synthesis in a scan-based integrated circuit. The processor 902 may represent a central processing unit of a personal computer, workstation, mainframe computer or other suitable digital processing device. The memory 901 can be an electronic memory or a magnetic or optical disk-based memory, or various combinations thereof. A designer interacts with the software run by the processor 902 to provide appropriate inputs via an input device 903, which may be a keyboard, disk drive or other suitable source of design information. The processor 902 provides outputs to the designer via an output device 904, which may be a display, a printer, a disk drive or various combinations of these and other elements.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for time-division demultiplexing and decompressing a compressed input stimulus, provided at a selected data-rate R1, into a decompressed stimulus, driven at a selected data-rate R2, for driving selected scan chains in a scan-based integrated circuit during scan-test mode, the scan-based integrated circuit containing a plurality of time-division demultiplexors (TDDMs), a plurality of decompressors, a plurality of compressors, a plurality of time-division multiplexors (TDMs), at least one high-speed clock CK1, at least one low-speed clock CK2, and a plurality of scan chains, each scan chain comprising multiple scan cells coupled in series; said method comprising:

(a) generating, shifting in, demultiplexing and decompressing said compressed input stimulus through said time-division demultiplexors and said decompressors as said decompressed stimulus to all said scan cells in said scan-based integrated circuit during a shift-in operation;

(b) capturing a test response to all said scan cells during a selected capture operation;

(c) compressing, multiplexing and shifting out said test response or said decompressed stimulus through said compressors and said time-division multiplexors as a compressed test response, while shifting in a new decompressed stimulus to all said scan cells, during a shift-out operation; and (d) repeating steps (b) to (c) until a predetermined criterion is reached wherein, by using both time-division demultiplexor and multiplexor pairs and decompressor and compressor pairs in combination, test data volume is reduced and effects of test time reduction are multiplied in comparison with effects of test time reduction achievable by separate use of time-division demultiplexor and multiplexor pairs and decompressor and compressor pairs.

2. The method of claim 1, wherein said high-speed clock CK1 is supplied externally from an automatic test equipment (ATE).

3. The method of claim 1, wherein said high-speed clock CK1 is generated internally using a first phase-locked loop (PLL).

4. The method of claim 1, wherein said high-speed clock CK1 is generated internally from said low-speed clock CK2.

5. The method of claim 1, wherein said low-speed clock CK2 is supplied externally from said automatic test equipment (ATE).

6. The method of claim 1, wherein said low-speed clock CK2 is generated internally from said high-speed clock CK1.

7. The method of claim 1, wherein said selected data-rate R1 is a greater-than-one integer multiple of said selected data-rate R2.

8. The method of claim 1, wherein said high-speed clock CK1 is used to sample said compressed input stimulus in said time-division demultiplexors (TDDMs); wherein said selected data-rate R1 matches the frequency of said high-speed clock CK1.

9. The method of claim 8, wherein said time-division demultiplexors (TDDMs) include a shift register driven by said high-speed clock CK1.

10. The method of claim 1, wherein said low-speed clock CK2 is used to control all said scan cells in said selected scan chains for driving said decompressed stimulus and said test responses into and out of said selected scan chains through said decompressors and said compressors, respectively; wherein said selected data-rate R2 matches the frequency of said low-speed clock CK2.

11. The method of claim 1, wherein said high-speed clock CK1 is used to control said time-division multiplexors (TDMs) for generating said compressed test response operating at said selected data-rate R1; wherein said selected data-rate R1 matches the frequency of said high-speed clock CK1.

12. The method of claim 11, wherein said time-division multiplexors (TDMs) further comprise a multiplexor and a controller driven by said high-speed clock CK1.

13. The method of claim 1, wherein said time-division demultiplexors (TDDMs) further comprise one or more first selected sequential logic gates driven by said high-speed clock CK1; wherein each said first selected sequential logic gate is selectively a flip-flop or a latch.

14. The method of claim 1, wherein said decompressors comprise one or more second selected combinational logic gates operating at said selected data-rate R2; wherein each said second selected combinational logic gate is selectively an AND gate, OR gate, NAND gate, NOR gate, Exclusive-OR (XOR) gate, Exclusive-NOR (XNOR) gate, multiplexor (MUX), buffer (BUF), or inverter (INV).

15. The method of claim 1, wherein said decompressors include a linear finite-state machine (LFSM) comprising one or more second selected sequential logic gates driven by said low-speed clock CK2; wherein each said second selected sequential logic gate is selectively a flip-flop or a latch.

16. The method of claim 1, wherein said compressors comprise one or more third selected combinational logic gates operating at said selected data-rate R2; wherein each said third selected combinational logic gate is selectively an Exclusive-OR (XOR) gate, Exclusive-NOR (XNOR) gate, buffer (BUF), or inverter (INV).

17. The method of claim 1, wherein said compressors include a multiple-input signature register (MISR) comprising one or more fourth selected sequential logic gates driven by said low-speed clock CK2; wherein each said fourth selected sequential logic gate is selectively a flip-flop or a latch.

18. The method of claim 1, wherein said time-division multiplexors (TDMs) further comprise one or more combinational logic gates operating at said selected data-rate R1; wherein each said combinational logic gate is selectively an AND gate, OR gate, NAND gate, NOR gate, Exclusive-OR (XOR) gate, Exclusive-NOR (XNOR) gate, multiplexor (MUX), buffer (BUF), or inverter (INV).

19. The method of claim 1, wherein said time-division multiplexors (TDMs) comprise one or more fourth selected sequential logic gates driven by said high-speed clock CK1; wherein each said fourth selected sequential logic gate is selectively a flip-flop or a latch.

20. The method of claim 1, wherein said decompressors and said compressors are selectively pipelined and embedded between said scan cells to allow said shift-in operation and said shift-out operation to be performed at high speed, respectively.

21. The method of claim 1, wherein said decompressors are selectively placed before said time-division demultiplexors (TDDMs); wherein said decompressors are driven by said high-speed clock CK1.

22. The method of claim 1, wherein said compressors are selectively placed after said time-division multiplexors (TDMs) ; wherein said compressors are driven by said high-speed clock CK1.

23. An apparatus for time-division demultiplexing and decompressing a compressed input stimulus, provided at a selected data-rate R1, into a decompressed stimulus, driven at a selected data-rate R2, for driving selected scan chains in a scan-based integrated circuit during scan-test mode, the scan-based integrated circuit containing at least one high-speed clock CK1, at least one low-speed clock CK2, and a plurality of scan chains, each scan chain comprising multiple scan cells coupled in series; said apparatus comprising:
 (a) a plurality of time-division demultiplexors (TDDMs);
 (b) a plurality of decompressors;
 (c) a plurality of compressors; and
 (d) a plurality of time-division multiplexors (TDMs) wherein,
 by using both time-division demultiplexor and multiplexor pairs and decompressor and compressor pairs in combination, test data volume is reduced and effects of test time reduction are multiplied in comparison with effects of test time reduction achievable by separate use of time-division demultiplexor and multiplexor pairs and decompressor and compressor pairs.

24. The apparatus of claim 23, wherein said high-speed clock CK1 is supplied externally from an automatic test equipment (ATE).

25. The apparatus of claim 23, wherein said high-speed clock CK1 is generated internally using a first phase-locked loop (PLL).

26. The apparatus of claim 23, wherein said high-speed clock CK1 is generated internally from said low-speed clock CK2.

27. The apparatus of claim 23, wherein said low-speed clock CK2 is supplied externally from said automatic test equipment (ATE).

28. The apparatus of claim 23, wherein said low-speed clock CK2 is generated internally from said high-speed clock CK1.

29. The apparatus of claim 23, wherein said selected data-rate R1 is a greater-than-one integer multiple of said selected data-rate R2.

30. The apparatus of claim 23, wherein said high-speed clock CK1 is used to sample said compressed input stimulus in said time-division demultiplexors (TDDMs); wherein said selected data-rate R1 matches the frequency of said high-speed clock CK1.

31. The apparatus of claim 30, wherein said time-division demultiplexors (TDDMs) include a shift register driven by said high-speed clock CK1.

32. The apparatus of claim 23, wherein said low-speed clock CK2 is used to control all said scan cells in said selected scan chains for driving said decompressed stimulus and said test responses into and out of said selected scan chains through said decompressors and said compressors, respectively; wherein said selected data-rate R2 matches the frequency of said low-speed clock CK2.

33. The apparatus of claim 23, wherein said high-speed clock CK1 is used to control said time-division multiplexors (TDMs) for generating said compressed test response operating at said selected data-rate R1; wherein said selected data-rate R1 matches the frequency of said high-speed clock CK1.

34. The apparatus of claim 33, wherein said time-division multiplexors (TDMs) further comprise a multiplexor and a controller driven by said high-speed clock CK1.

35. The apparatus of claim 23, wherein said time-division demultiplexors (TDDMs) further comprise one or more first selected sequential logic gates driven by said high-speed clock CK1; wherein each said first selected sequential logic gate is selectively a flip-flop or a latch.

36. The apparatus of claim 23, wherein said decompressors comprise one or more combinational logic gates operating at said selected data-rate R2; wherein each said combinational logic gate is selectively an AND gate, OR gate, NAND gate, NOR gate, Exclusive-OR (XOR) gate, Exclusive-NOR (XNOR) gate, multiplexor (MUX), buffer (BUF), or inverter (INV).

37. The apparatus of claim 23, wherein said decompressors include a linear finite-state machine (LFSM) comprising one or more sequential logic gate driven by said low-speed clock CK2; wherein each said sequential logic gate is selectively a flip-flop or a latch.

38. The apparatus of claim 23, wherein said compressors comprise one or more combinational logic gate operating at said selected data-rate R2;
wherein each said combinational logic gate is selectively an Exclusive-OR (XOR) gate, Exclusive-NOR (XNOR) gate, buffer (BUF), or inverter (INV).

39. The apparatus of claim 23, wherein said compressors include a multiple-input signature register (MISR) comprising one or more sequential logic gate driven by said low-speed clock CK2; wherein each said sequential logic gate is selectively a flip-flop or a latch.

40. The apparatus of claim 23, wherein said time-division multiplexors (TDMs) further comprise one or more combinational logic gates operating at said selected data-rate R1; wherein each said combinational logic gate is selectively an AND gate, OR gate, NAND gate, NOR gate, Exclusive-OR (XOR) gate, Exclusive-NOR (XNOR) gate, multiplexor (MUX), buffer (BUF), or inverter (INV).

41. The apparatus of claim 23, wherein said time-division multiplexors (TDMs) comprise one or more sequential logic gate driven by said high-speed clock CK1; wherein each said sequential logic gate is selectively a flip-flop or a latch.

42. The apparatus of claim 23, wherein said decompressors and said compressors are selectively pipelined and embedded between said scan cells to allow said shift-in operation and said shift-out operation to be performed at high speed, respectively.

43. The apparatus of claim 23, wherein said decompressors are selectively placed before said time-division demultiplexors (TDDMs); wherein said decompressors are driven by said high-speed clock CK1.

44. The apparatus of claim 23, wherein said compressors are selectively placed after said time-division multiplexors (TDMs); wherein said compressors are driven by said high-speed clock CK1.

45. A method for reducing test time, test data volume, and scan pin count for a scan-based integrated circuit, the scan-based integrated circuit containing a plurality of high-speed I/O pads and a plurality of scan chains, each scan chain comprising multiple scan cells coupled in series; said method comprising
  (a) providing time-division demultiplexor and multiplexor pairs for allowing scan data transfer between selected high-speed I/O pads and selected scan chains in said scan-based integrated circuit during test; and
  (b) using decompressor and compressor pairs to perform scan compression and using said time-division demultiplexor and multiplexor pairs to operate said selected I/O pads at high speed, while operating said selected scan chains at low speed
  wherein, by using both said time-division demultiplexor and multiplexor pairs and said decompressor and compressor pairs in combination, test data volume is reduced and effects of test time reduction are multiplied in comparison with effects of test time reduction achievable by separate use of time-division demultiplexor and multiplexor pairs and decompressor and compressor pairs.

46. The method of claim 45, wherein said high-speed I/O pad is a high-speed I/O core pin embedded in said scan-based integrated circuit.

* * * * *